(12) United States Patent
Murakami et al.

(10) Patent No.: US 9,614,117 B2
(45) Date of Patent: Apr. 4, 2017

(54) SOLAR CELL MANUFACTURING METHOD

(71) Applicant: SHIN-ETSU CHEMICAL CO., LTD., Tokyo (JP)

(72) Inventors: Takashi Murakami, Annaka (JP); Takenori Watabe, Annaka (JP); Hiroyuki Otsuka, Annaka (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 0 days.

(21) Appl. No.: 14/433,411

(22) PCT Filed: Aug. 23, 2013

(86) PCT No.: PCT/JP2013/072490
§ 371 (c)(1),
(2) Date: Apr. 3, 2015

(87) PCT Pub. No.: WO2014/054350
PCT Pub. Date: Apr. 10, 2014

(65) Prior Publication Data
US 2015/0228841 A1 Aug. 13, 2015

(30) Foreign Application Priority Data
Oct. 4, 2012 (JP) .................................. 2012-221850

(51) Int. Cl.
*H01L 31/18* (2006.01)
*H01L 31/0216* (2014.01)
(Continued)

(52) U.S. Cl.
CPC ........ *H01L 31/18* (2013.01); *H01L 31/02168* (2013.01); *H01L 31/022425* (2013.01);
(Continued)

(58) Field of Classification Search
CPC ....... H01L 31/02168; H01L 31/022425; H01L 31/03125; H01L 31/06; H01L 31/068
See application file for complete search history.

(56) References Cited

U.S. PATENT DOCUMENTS

| | | | |
|---|---|---|---|
| 4,931,323 A | 6/1990 | Manitt et al. | |
| 8,778,720 B2 | 7/2014 | Kim et al. | |

(Continued)

FOREIGN PATENT DOCUMENTS

| | | |
|---|---|---|
| JP | 4-214675 A | 8/1992 |
| JP | 2010-502021 A | 1/2010 |

(Continued)

OTHER PUBLICATIONS

Extended (Supplementary) European Search Report dated Apr. 4, 2016, issued in counterpart European Patent Application No. 13843248.9. (7 pages).

(Continued)

*Primary Examiner* — Seahvosh Nikmanesh
(74) *Attorney, Agent, or Firm* — Westerman, Hattori, Daniels & Adrian, LLP

(57) ABSTRACT

The present invention relates to a method for manufacturing a solar cell having excellent long-term reliability and high efficiency, said method including: a step (7) for applying a paste-like electrode agent to an antireflection film formed on the light receiving surface side of a semiconductor substrate having at least a pn junction, said electrode agent containing a conductive material; and an electrode firing step (9) having local heat treatment (step (9*a*)) for applying heat such that at least a part of the conductive material is fired by irradiating merely the electrode agent-applied portion with a laser beam, and whole body heat treatment (step (9*b*)) for heating the whole semiconductor substrate to a temperature below 800° C.

12 Claims, 5 Drawing Sheets

(51) Int. Cl.
*H01L 31/0224* (2006.01)
*H01L 31/0312* (2006.01)
*H01L 31/06* (2012.01)
*H01L 31/068* (2012.01)

(52) U.S. Cl.
CPC ............ *H01L 31/022433* (2013.01); *H01L 31/03125* (2013.01); *H01L 31/06* (2013.01); *H01L 31/068* (2013.01); *Y02E 10/50* (2013.01)

(56) References Cited

U.S. PATENT DOCUMENTS

| | | |
|---|---|---|
| 2010/0069278 A1 | 3/2010 | Licciardi |
| 2010/0167457 A1 | 7/2010 | Kim et al. |
| 2010/0219535 A1 | 9/2010 | Kutzer et al. |
| 2010/0267194 A1 | 10/2010 | Aleman et al. |
| 2013/0095603 A1 | 4/2013 | Cabal |
| 2013/0133738 A1 | 5/2013 | Mitta et al. |

FOREIGN PATENT DOCUMENTS

| | | |
|---|---|---|
| JP | 2011-151192 A | 8/2011 |
| JP | 2011-258813 A | 12/2011 |
| JP | 2012-514342 A | 6/2012 |
| WO | 2006/087786 A1 | 8/2006 |
| WO | 2011/111029 A1 | 9/2011 |

OTHER PUBLICATIONS

International Search Report dated Oct. 8, 2013, issued in corresponding application No. PCT/JP2013/072490.

SOLAR CELL MANUFACTURING METHOD

TECHNICAL FIELD

This invention relates to a method for manufacturing a solar cell.

BACKGROUND ART

For the methods currently used for the manufacture of commercial crystalline solar cells, a cost reduction is the important problem. To this end, a combination of heat diffusion process with screen printing process is generally employed. The detail of the method is as illustrated in FIG. 1, for example.

First, a single crystal silicon ingot pulled up by the Czochralski (CZ) method or a polycrystalline silicon ingot prepared by the casting method is sliced by the multi-wire method, yielding a p-type silicon substrate (Step (1)). Next, slice damages are removed from the surface by an alkaline solution, and a texture with a maximum height of about 10 μm is formed on the surface (Step (2)). An n-type diffusion layer is formed in the substrate surface by a heat diffusion process (Step (3)). Further, a silicon nitride film is deposited on a light-receiving surface, typically to a thickness of about 70 nm, forming an antireflection/passivation film. Next, the glass formed on the substrate surface is etched away, and cleaning treatment is carried out (Step (4)), after which an antireflective film is formed on the light-receiving surface side of the substrate (Step (5)). Next, using a screen printing process, an aluminum-based electrode paste is printed over the entire back surface of the substrate which is a non-light-receiving surface, and dried to form a back electrode (Step (6)). Next, on the light-receiving surface side of the substrate, an electrode paste (or electrode agent) containing metal particles such as silver and additives such as glass frit is screen printed in a comb-shaped pattern with a width of about 100 to 200 μm, and dried (Step (7)). Subsequently, junction isolation treatment is carried out (Step (8)), and the overall substrate is heat treated to fire the electrode paste-applied portion into a front electrode (Step (99)). This heat treatment causes to fire metal particles in the electrode paste for suppressing interconnect resistance and glass frit to penetrate through the silicon nitride film (known as fire-through), for thereby providing conduction between the light-receiving surface electrode and the diffusion layer, and forming an electric field layer of Al—Si at the interface between the non-light-receiving surface electrode and the silicon substrate.

With regard to the electrode firing heat treatment, for example, JP-A 2011-258813 (Patent Document 1) describes that for the electrode firing heat treatment, the heating zone is typically at a temperature of 500 to 950° C., especially 600 to 850° C., preferably for a heating time of 5 to 30 seconds, and the cooling zone is at a temperature of 25 to 500° C., preferably for a cooling time of 5 to 30 seconds. The heating temperature includes a relatively high temperature range.

However, in order to form an electrode with long-term reliability through the above-mentioned electrode firing heat treatment, the peak temperature of the electrode firing heat treatment must be 800° C. or higher for the purpose of promoting firing of silver particles. At this point, the substrate is also exposed to high temperature so that the bulk lifetime of the substrate is reduced, and the surface recombination velocity is increased, giving rise to the problem of failing to maintain high conversion efficiency.

Notably, JP-A 2012-514342 (Patent Document 2) is one of previous documents relevant to the present invention.

CITATION LIST

Patent Documents

Patent Document 1: JP-A 2011-258813
Patent Document 2: JP-A 2012-514342

SUMMARY OF INVENTION

Technical Problem

An object of the invention, which has been made under the above-mentioned circumstances, is to provide a method for manufacturing a solar cell having long-term reliability and high efficiency.

Solution to Problem

To attain the above object, the invention provides a method for manufacturing a solar cell, as defined below.
[1] A method for manufacturing a solar cell, comprising
 the step of applying a paste-like electrode agent containing a conductive material onto an antireflection film formed on a light-receiving surface side of a semiconductor substrate having at least a pn junction, and
 the electrode firing step including local heat treatment of irradiating a laser beam only to the electrode agent-applied portion to heat the portion such that at least a part of the conductive material is fired, and overall heat treatment of heating the overall semiconductor substrate at a temperature below 800° C.
[2] The method of [1] wherein the electrode firing step includes heat treatment in sequence of the local heat treatment and the overall heat treatment or in sequence of the overall heat treatment and the local heat treatment.
[3] The method of [1] or [2] wherein the overall heat treatment includes a peak heating temperature of 600 to 780° C.
[4] The method of any one of [1] to [3] wherein the laser beam in the local heat treatment has a wavelength of 300 to 500 nm.
[5] The method of any one of [1] to [4] wherein the local heat treatment and a treatment of isolating the pn junction using laser beam are continuously carried out.

Advantageous Effects of Invention

The invention is effective for promoting the electrode firing over the prior art, suppressing interconnect resistance and contact resistance, improving long-term reliability, and suppressing a reduction of the bulk lifetime of the substrate and an increase of the surface recombination velocity. There is obtained a crystalline solar cell having improved long-term reliability and high efficiency.

DESCRIPTION OF EMBODIMENTS

Below, the method of manufacturing a solar cell according to the invention is described.

Figure 1:
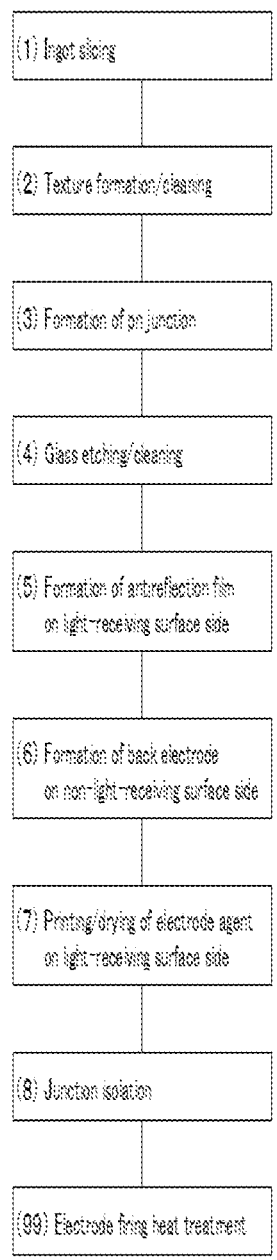
FIG. 1 is a chart showing one exemplary method of manufacturing a solar cell according to the prior art method.
Figure 2:
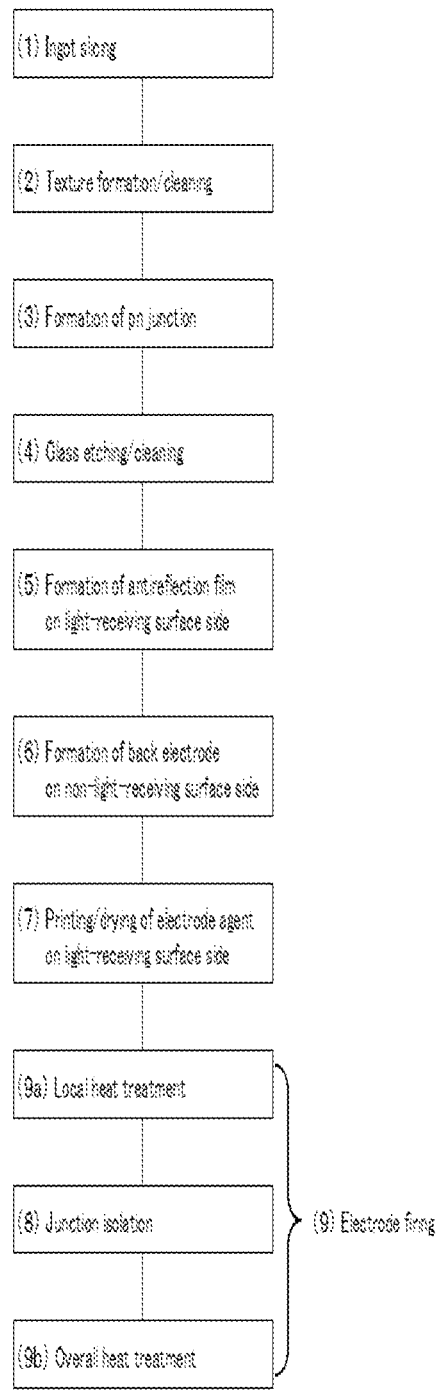
FIG. 2 is a flow diagram showing one exemplary method of manufacturing a solar cell according to the invention.
Figure 3:
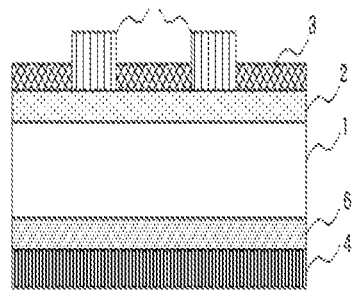
FIG. 3 is a cross-sectional view showing an exemplary construction of a solar cell.

FIG. 2 is a flow diagram showing one exemplary method of manufacturing a solar cell according to the invention. The steps involved in the method are described with reference to a solar cell of the construction shown in FIG. 3.

First, a silicon substrate is furnished. Its conductivity type may be either n-type or p-type. A high purity silicon substrate is obtained by slicing a single crystal or polycrystalline ingot doped with a Group III element such as B or Ga by means of a multi-wire saw, into a p-type silicon substrate 1 (simply referred to as substrate) (Step (1)). The substrate preferably has a resistivity of 0.1 to 20 $\Omega \cdot cm$, with a resistivity of 0.5 to 2.0 $\Omega \cdot cm$ being especially preferred for the manufacture of high-performance solar cells.

Next, the slice-damaged layer of the substrate 1 is removed by etching with a concentrated alkali aqueous solution such as sodium hydroxide or potassium hydroxide solution having a concentration of 5 to 60 wt %, or a mixed acid of hydrofluoric acid and nitric acid.

After damage etching, the substrate 1 is provided on its front and back surfaces with a random texture of microscopic asperities (Step (2)). Texture formation is effective for reducing the reflectivity of solar cells. When a single crystal silicon substrate is textured by anisotropic etching with alkaline solution, crystal face orientation (100) is preferred. Another crystal face orientation is acceptable in the case of physical polishing by means of a polishing machine or the like.

The texture formation is followed by cleaning in an acidic aqueous solution such as hydrochloric acid, sulfuric acid, nitric acid, hydrofluoric acid, or a mixture thereof. From the aspects of economy and performance, cleaning in hydrochloric acid is preferred. For improving cleanliness, cleaning may be carried out in a mixture of hydrochloric acid and 0.5 to 5 wt % hydrogen peroxide while heating at 60 to 90° C.

Subsequently, by vapor phase diffusion process using phosphorus oxychloride ($POCl_3$), for example, an emitter layer (n-type diffusion layer) 2 is formed on the light-receiving surface of the substrate 1 (Step (3)). As a result, a pn junction is formed. The phosphorus concentration and depth of the emitter layer 2 are determined in terms of a balance of resistance to current flow across the emitter layer 2 and surface passivation effect. It is generally recommended that the emitter layer 2 have a sheet resistance of about 30 to 100 ohm/square ($\Omega/\square$) as measured by the four probe method.

Next, the glass component formed on the surface of substrate 1 by the vapor phase diffusion process is etched away with hydrofluoric acid or the like. Subsequently, the substrate is subjected to customary cleaning treatment using hydrochloric acid/hydrogen peroxide mixed solution or ammonia/hydrogen peroxide mixed solution (Step (4)).

Next, an antireflective coating 3 also serving as passivation film is formed on the emitter layer 2 on the light-receiving surface side of the substrate 1 (Step (5)). For example, using a chemical vapor deposition system such as plasma-enhanced CVD system, a silicon nitride film of about 100 nm thick is formed as the antireflective coating 3. As the reactant gas for deposition, a mixture of monosilane ($SiH_4$) and ammonia ($NH_3$) is often used, although nitrogen may be used instead of ammonia. A desired reflectivity for the antireflective coating 3 is established by adding $H_2$ gas for diluting the coating (deposit species), adjusting the process pressure or diluting the reactant gases. The deposit species for the antireflective coating 3 is not limited to silicon nitride while any of silicon oxide, silicon carbide, aluminum oxide, amorphous silicon, microcrystalline silicon and titanium oxide, which are deposited by not only the CVD, but also suitable methods such as heat treatment and atomic layer deposition, may be used instead.

Next, an electrode agent in the form of an aluminum paste obtained by mixing Al particles with an organic binder is screen printed on the non-light-receiving surface (back surface) of the substrate 1, and heated at about 150 to 250° C. for about 5 to 15 minutes for drying, forming a back electrode 4 (Step (6)). It is noted that on the non-light-receiving surface side of the substrate 1, a back surface field layer may be formed by vapor phase diffusion of boron bromide, for example. In this case, from the aspect of suppressing interconnect resistance, it is preferred to form the back electrode 4 by screen printing an electrode agent in the form of a silver paste.

Subsequently, an electrode agent in the form of a silver paste obtained by mixing Ag particles and glass frit with an organic binder is coated on the antireflective coating 3 on the light-receiving surface side of the substrate 1 in a predetermined pattern, and heated at about 150 to 250° C. for about 5 to 15 minutes for drying, forming an electrode agent-coated portion (Step (7)). Specifically, the silver paste is screen printed in a comb-shaped electrode pattern, that is, a configured pattern of finger electrodes and bus bar electrodes, and dried.

The glass frit used herein may be lead-based glass frit (e.g., $PbO—B_2O_3—SiO_2$) or lead-free glass frit (e.g., $Bi_2O_3—B_2O_3—SiO_2—CeO_2—LiO_2—NaO_2$), but not limited thereto. The shape of glass frit is not particularly limited, and it may be of spherical or irregular shape, for example. Also the particle size of glass frit is not particularly limited, although it is preferred for working or the like that an average of particle size (weight average particle size) be in a range of 0.01 to 10 μm, more preferably 0.05 to 1 μm.

Also, the organic binder used herein may be selected from cellulose resins (e.g., ethyl cellulose and nitrocellulose) and (meth)acrylic resins (e.g., polymethyl acrylate, polymethyl methacrylate), but not limited thereto. The amount of the organic binder added is typically 1 to 10 parts by weight, preferably 1 to 4 parts by weight per 100 parts by weight of the conductive particles (Ag particles).

Next, local heat treatment is carried out by irradiating a laser beam only to the electrode agent-applied portion to heat the portion such that at least a part of the conductive material is fired (Step (9a)).

The laser beam used herein is preferably an emission from a pulse laser. The wavelength range may be determined in accordance with the components used in the electrode agent, especially the type of conductive material. When a commonly used electrode agent based on silver (Ag) is selected, a wavelength range of 300 to 500 nm where silver has a high coefficient of absorption is preferable.

Also, laser beam scanning is controlled so as to direct the laser beam only to the electrode agent-applied portion. It is recommended that laser power, frequency, pulse width, laser beam diameter (spot diameter), scanning speed and other parameters are adjusted whereby the heating conditions at the electrode agent-applied portion are adjusted such that at least a part of the conductive material may be fired. Specifically, local heating is carried out only on the electrode agent-applied portion in the configured pattern corresponding to bus bar electrodes 5a and finger electrodes 5b to constitute the front electrode 5 such that the relevant region may be uniformly heated.

Through the local heat treatment, the organic binder is burnt off in the electrode agent-applied portion and firing takes place to bind at least a part (or all as the case may be) of the conductive material together. This treatment has not yet achieved fire-through or metallization through the anti-reflective coating 3. Since the heat treatment at this stage is thus a laser beam-aided, brief, surface heating limited to the electrode agent-applied portion, it poses minimal thermal influence on the pn junction interface immediately below the electrode agent-applied portion, thus suppressing a reduction of bulk lifetime and an increase of surface recombination velocity.

Next, the pn junction is isolated (junction isolation) (Step (8)). Aiming to prevent the phenomenon that positive and negative electrodes of a solar cell are linked via a high concentration dopant diffusion layer of the same conductivity type and thus short-circuited so that performance is degraded, the junction isolation is to establish the structure wherein positive and negative electrodes are not linked via a dopant diffusion layer of the same conductivity type, by partially removing the diffusion layer. The technique of junction isolation may be any of a technique of etching a substrate surface layer either by dry etching or wet etching, a technique of physical grinding by a grinding machine, and laser ablation technique, depending on the stage of the manufacture procedure when junction isolation is carried out. For example, junction isolation may be carried out by laser machining the outer periphery of the substrate on the light-receiving surface side or back surface side.

It is noted that the junction isolation need not necessarily be carried out after the local heat treatment, and may be carried out after formation of the pn junction, after formation of the antireflective coating 3, or after the electrode firing step.

Next, overall heat treatment is carried out to heat the overall substrate 1 at a temperature below 800° C. (Step (9b)). Specifically, the substrate 1 having undergone local heat treatment is introduced in a firing furnace commonly used in the art, where the substrate 1 is heated so that the peak heating temperature during the overall heat treatment may be in a range of preferably 600 to 780° C., more preferably 650 to 760° C. The heating time may be 5 to 30 seconds. As used herein, the heating temperature refers to the substantial heating temperature of the substrate 1 rather than the preset temperature of the firing furnace.

By setting the peak heating temperature during the overall heat treatment in a range of 600 to 780° C., the bulk lifetime of the substrate 1 is maintained high and the surface recombination velocity is maintained low. If the peak heating temperature exceeds 780° C., the bulk lifetime may be reduced due to metal contamination, and a high conversion efficiency may be lost because the hydrogen bonded to the dangling bond in the silicon nitride film as the antireflective coating 3 formed on the substrate 1 surface is eliminated, allowing the surface recombination velocity to increase. If the peak heating temperature is lower than 600° C., the influence due to metal contamination is reduced so that a high bulk lifetime may be maintained, but a high conversion efficiency may be lost because the bond between hydrogen and the dangling bond in the antireflective coating 3 becomes insufficient so that the surface recombination velocity is not fully reduced.

Through the overall heat treatment, the electrode agent-applied portion having undergone local heat treatment is completely fired, and the glass frit component in the electrode agent-applied portion is decomposed by reacting with the silicon nitride film or antireflective coating 3, which causes silver particles to penetrate through the anti-reflective coating 3 to form a front electrode 5 in low ohmic contact with the emitter layer 2 (known as "fire-through" process). The front electrode 5 thus formed has a resistivity which is desirably as low as possible, and preferably up to 5 $\mu\Omega\cdot$cm, more preferably up to 3 $\mu\Omega\cdot$cm. The electrical contact resistance between silicon (substrate 1) and the front electrode 5 is correlated to the carrier concentration on silicon surface, i.e., dopant concentration and the electrode material. In the case of common silver electrodes, the dopant concentration on silicon surface must be at least $1\times10^{19}$ cm$^{-3}$, preferably at least $5\times10^{19}$ cm$^{-3}$.

Also, through the overall heat treatment, a back surface field (BSF) layer 6 which becomes an electric field layer of Al—Si is formed at the interface between the back electrode 4 and the substrate 1.

The local heat treatment (Step (9a)) and the overall heat treatment (Step (9b)) are collectively referred to as electrode firing (Step (9)). Although heat treatment is conducted in sequence of local heat treatment (Step (9a)) and ensuing overall heat treatment (Step (9b)) in the embodiment described above, heat treatment may also be conducted in sequence of overall heat treatment (Step (9b)) and ensuing local heat treatment (Step (9a)). Specifically, after coating of the electrode agent, overall heat treatment of heating the substrate 1 overall at a temperature below 800° C. is carried out so that the electrode agent-applied portion is fired to some extent and fired through the antireflective coating 3 to contact the emitter layer 2, and thereafter, local heat treatment is carried out to completely fire the electrode agent-applied portion. This sequence of heat treatments exerts the same effect as that obtained from the sequence of local heat treatment (Step (9a)) and ensuing overall heat treatment (Step (9b)).

It is also acceptable that the step (Step (7)) of printing and drying the electrode agent on the light-receiving surface side of substrate 1 precedes the step (Step (6)) of forming a back electrode on the non-light-receiving surface side.

With the manufacturing method described above, electrode firing is promoted over the prior art, interconnect resistance and contact resistance are suppressed, long-term reliability is improved, a reduction of the bulk lifetime of a substrate and an increase of surface recombination velocity are suppressed. A crystalline solar cell having improved long-term reliability and high efficiency is obtained.

Figure 4:
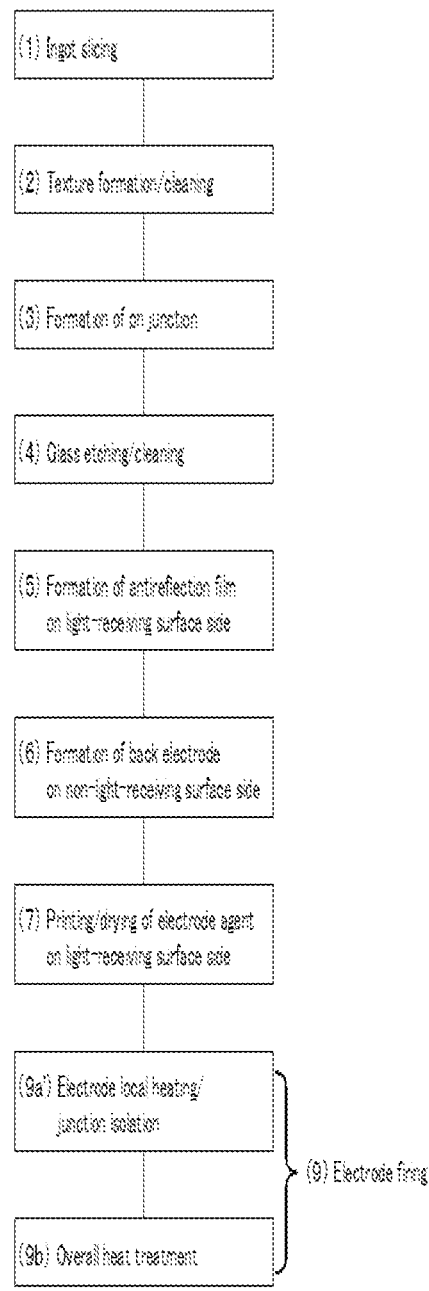
FIG. 4 is a flow diagram showing another exemplary method of manufacturing a solar cell according to the invention.

In the embodiment described above, the local heat treatment (Step (9a)) and the junction isolation treatment (Step (8)) are separately carried out. As shown in FIG. 4, when the junction isolation treatment is carried out using laser beam, a single step (9a') of continuously carrying out local heat treatment and junction isolation treatment may be possible by using a common laser machining tool. For example, with the substrate 1 fixedly mounted on the stage of the laser machining tool, the local heat treatment is first carried out, and subsequently, the junction isolation treatment may be carried out by irradiating to the substrate 1 a laser beam having a wavelength changed for machining.

Although the embodiment wherein the light-receiving surface is only a single side, that is, an electrode agent is coated only on an antireflective coating on the front surface, fired and fired-through has been illustrated, the invention is not limited thereto. The invention is applicable to solar cells of the bifacial light-receiving type wherein an antireflective coating is formed on a diffusion layer on each of the front and back surfaces and an electrode agent is coated thereon, fired and fired-through.

EXAMPLES

Examples and Comparative Examples are given below by way of illustration of the invention, but not by way of limitation.

Example 1

Solar cell samples were fabricated by the following procedure.

First, there were furnished 1,000 silicon substrates of boron-doped p-type single crystal as prepared by the CZ method, having an as-sliced resistivity of 0.5 to 3.0 Ω·cm, face orientation (100), thickness 200 μm, and square shape 156×156 mm (simply referred to as substrates).

Next, the substrate was immersed in 40 wt % sodium hydroxide solution where the damaged layer was etched away. The substrate was then immersed in a 3 wt % sodium hydroxide aqueous solution with isopropyl alcohol added where a random texture was formed on both surfaces by wet etching.

Next, two substrates were combined with their non-light-receiving surfaces mated, and the assembly was heat treated at 870° C. in a phosphorus oxychloride atmosphere, for doping the light-receiving surfaces with phosphorus in high concentration, to form an emitter layer having a sheet resistance of 50 Ω/□.

Next, the substrate was treated with hydrofluoric acid to remove phosphorus glass on the surface, cleaned with ammonia/hydrogen peroxide mixed solution, rinsed, and dried.

Next, on the substrate as cleaned, using a plasma-enhanced CVD system, a silicon nitride film as an antireflection/passivation film was deposited over the entire light-receiving surface to a thickness of 90 nm.

Figure 5:
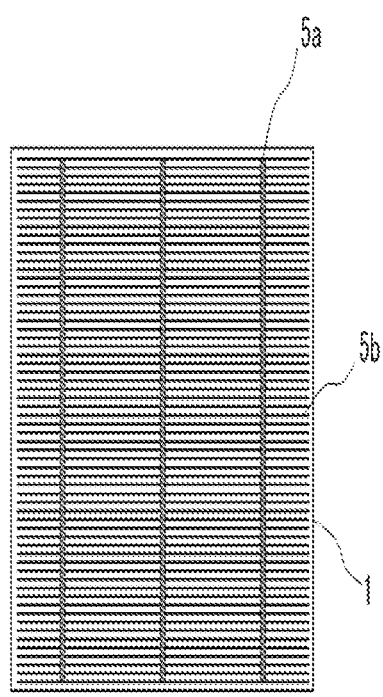
FIG. 5 is a schematic view of one exemplary electrode pattern on the light-receiving surface side of a solar cell.

Next, on the light-receiving surface side of the substrate 1, using a screen printing plate having a pattern of bus bar electrodes 5a and finger electrodes 5b as shown in FIG. 5, an electrode paste containing silver as main ingredient and lead-free glass frit ($Bi_2O_3$—$B_2O_3$—$SiO_2$—$CeO_2$—$LiO_2$—$NaO_2$) as additive was screen printed, and heated at a temperature of 200° C. for 15 minutes for drying. The pattern of FIG. 5 included 78 pattern features for finger electrode 5b having a length of 154 mm, a spacing of 2.0 mm, and an opening width of 100 μm, and 3 pattern features for bus bar electrode 5a having a length of 154 mm, a spacing of 38.5 mm, and an opening width of 1,500 μm.

Next, at the non-light-receiving surface side of the substrate, a silver-based electrode paste was screen printed onto the bus bar portion and an aluminum-based electrode paste was screen printed over the entire surface exclusive of the bus bar portion, and dried at 200° C. for 15 minutes.

Next, local heat treatment was carried out on the substrate having the electrode pastes printed and dried thereon, by irradiating a laser beam to the finger electrode-forming pattern portion and bus bar electrode-forming pattern portion. The laser conditions for the local heat treatment included a laser beam with power 12.5 W, wavelength 355 nm, frequency 150 kHz, pulse width 13 nm, and spot diameter 50 μm, and scanning at a speed of 1,000 mm/sec.

Next, junction isolation treatment was carried out by the laser ablation method of scanning the substrate round with a laser beam along its outer periphery at a distance of 0.5 mm therefrom. The laser conditions for the junction isolation treatment included a laser beam with power 12.5 W, wavelength 532 nm, frequency 150 kHz, pulse width 13 nm, and spot diameter 25 μm, and scanning at a speed of 1,000 mm/sec.

Next, the overall substrate was heated according to a heating profile having a peak at a heating temperature of 760° C. for 10 seconds, to simultaneously form electrodes on the light-receiving and non-light-receiving surfaces.

Example 2

Solar cell samples were fabricated by the same procedure as in Example 1 except that local heat treatment and junction isolation treatment were continuously carried out with the aid of laser beam (the respective laser conditions were the same as in Example 1).

Comparative Example 1

Solar cell samples were fabricated by the same procedure as in Example 1 except that local heat treatment was omitted, and after the junction isolation treatment, the substrate was heated overall according to a heating profile having a peak at a heating temperature of 800° C. for 10 seconds, to simultaneously form electrodes on the light-receiving and non-light-receiving surfaces.

The solar cell samples fabricated as above were measured for characteristics (open circuit voltage, short-circuit current, fill factor, and conversion efficiency) by a current-voltage meter using simulative sunlight with spectrum AM (air mass) 1.5 global. The results are shown in Table 1.

As compared with Comparative Example 1 involving electrode firing treatment by high-temperature overall heating, Examples 1 and 2 involving electrode firing treatment by laser-aided local heat treatment and low-temperature overall heat treatment both showed outstanding increases of open circuit voltage and short-circuit current and at least comparable fill factor.

TABLE 1

| | Open circuit voltage | | Short-circuit current | | Fill factor | | Conversion efficiency | |
|---|---|---|---|---|---|---|---|---|
| | Average (mV) | S.D. | Average (mA·cm$^2$) | S.D. | Average (%) | S.D. | Average (%) | S.D. |
| Example 1 (Invention) | 625.2 | 1.88 | 34.3 | 0.21 | 79.2 | 0.27 | 17.0 | 0.12 |
| Example 2 (Invention) | 625.7 | 1.98 | 34.1 | 0.19 | 79.3 | 0.26 | 16.9 | 0.11 |
| Comparative Example 1 (Prior art) | 621.4 | 2.18 | 32.8 | 0.32 | 79.1 | 0.29 | 16.1 | 0.17 |

Although the invention has been described with reference to the embodiments illustrated in the drawings, the invention is not limited to the illustrated embodiments. Other embodiments, changes, modifications and omissions may be made as long as such occurs to those skilled in the art. All such embodiments are included in the scope of the invention as long as the desired effects and results are available.

REFERENCE SIGNS LIST 1 p-type silicon substrate (semiconductor substrate)
2 emitter layer (n-type diffusion layer)
3 antireflective film
4 back electrode
5 front electrode
5a bus bar electrode
5b finger electrode
6 BSF layer

The invention claimed is:

1. A method for manufacturing a solar cell, comprising:
the step of applying a paste-like electrode agent containing a conductive material onto an antireflection film formed on a light-receiving surface side of a semiconductor substrate having at least a pn junction, and
the electrode firing step including local heat treatment of irradiating a laser beam only to the electrode agent-applied portion to heat the portion such that at least a part of the conductive material is fired, wherein the local heat treatment has not yet achieved fire-through the antireflective film, and overall heat treatment of heating the overall semiconductor substrate at a temperature below 800° C., wherein the overall heat treatment is carried out so that the electrode agent-applied portion is fired to some extent and fired through the antireflective film,
wherein the electrode agent-applied portion is completely fired and the conductive material penetrates through the antireflective film to form an electrode in ohmic contact with the semiconductor substrate by the local heat treatment and the overall heat treatment.

2. The method of claim 1 wherein the electrode firing step includes heat treatment in sequence of the local heat treatment and the overall heat treatment or in sequence of the overall heat treatment and the local heat treatment.

3. The method of claim 1 wherein the overall heat treatment includes a peak heating temperature of 600 to 780° C.

4. The method of claim 1 wherein the laser beam in the local heat treatment has a wavelength of 300 to 500 nm.

5. The method of claim 1 wherein the local heat treatment and a treatment of isolating the pn junction using laser beam are continuously carried out.

6. The method of claim 2 wherein the overall heat treatment includes a peak heating temperature of 600 to 780° C.

7. The method of claim 2 wherein the laser beam in the local heat treatment has a wavelength of 300 to 500 nm.

8. The method of claim 3 wherein the laser beam in the local heat treatment has a wavelength of 300 to 500 nm.

9. The method of claim 2 wherein the local heat treatment and a treatment of isolating the pn junction using laser beam are continuously carried out.

10. The method of claim 3 wherein the local heat treatment and a treatment of isolating the pn junction using laser beam are continuously carried out.

11. The method of claim 4 wherein the local heat treatment and a treatment of isolating the pn junction using laser beam are continuously carried out.

12. The method of claim 1, wherein the electrode contacts an emitter layer formed on the light-receiving surface of the semiconductor substrate.

* * * * *